United States Patent
Aida et al.

(10) Patent No.: US 12,224,155 B2
(45) Date of Patent: Feb. 11, 2025

(54) ION MILLING DEVICE

(71) Applicant: Hitachi High-Tech Corporation, Tokyo (JP)

(72) Inventors: Shota Aida, Tokyo (JP); Hisayuki Takasu, Tokyo (JP); Atsushi Kamino, Tokyo (JP); Hitoshi Kamoshida, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 393 days.

(21) Appl. No.: 17/788,610

(22) PCT Filed: Dec. 24, 2019

(86) PCT No.: PCT/JP2019/050527
§ 371 (c)(1),
(2) Date: Jun. 23, 2022

(87) PCT Pub. No.: WO2021/130843
PCT Pub. Date: Jul. 1, 2021

(65) Prior Publication Data
US 2022/0367148 A1   Nov. 17, 2022

(51) Int. Cl.
*H01J 37/305* (2006.01)
*H01J 37/20* (2006.01)

(52) U.S. Cl.
CPC .......... *H01J 37/3056* (2013.01); *H01J 37/20* (2013.01); *H01J 2237/31745* (2013.01); *H01J 2237/31749* (2013.01)

(58) Field of Classification Search
CPC ................... H01J 37/3056; H01J 37/20; H01J 2237/31745; H01J 2237/31749
See application file for complete search history.

(56) References Cited

U.S. PATENT DOCUMENTS 6,723,998 B2   4/2004   Bisson et al.
2006/0097195 A1   5/2006   Angel et al.
(Continued)

FOREIGN PATENT DOCUMENTS

JP   61-284037 A   12/1986
JP   8-5528 A   1/1996
(Continued)

OTHER PUBLICATIONS

International Search Report (PCT/ISA/210) issued in PCT Application No. PCT/JP2019/050527 dated Mar. 3, 2020 with English translation (four (4) pages).
(Continued)

*Primary Examiner* — Nicole M Ippolito
*Assistant Examiner* — Hanway Chang
(74) *Attorney, Agent, or Firm* — Crowell & Moring LLP

(57) ABSTRACT

Provided is an ion milling apparatus capable of enhancing reproducibility of an ion distribution. The ion milling apparatus includes: an ion source 101; a sample stage 102 on which a sample to be processed by being irradiated with an unfocused ion beam from the ion source 101 is placed; and a measurement member holding unit 106 that holds an ion beam current measurement member 105. A covering material 120 is provided so as to cover at least a surface of the measurement member holding unit 106 and the sample stage 102 facing the ion source 101. A material of the covering material 120 contains, as a main component, an element having an atomic number smaller than that of an element of a material of a structure on which the covering material is provided. The ion beam current measurement member 105 is moved in an irradiation range of the ion beam on a trajectory, which is located between the ion source and the sample stage, in a state where the ion beam is output from the ion source 101 under a first irradiation condition, and an (Continued)

ion beam current flowing when the ion beam current measurement member 105 is irradiated with the ion beam is measured.

13 Claims, 7 Drawing Sheets

(56) References Cited

U.S. PATENT DOCUMENTS

| | | | |
|---|---|---|---|
| 2010/0072515 | A1 | 3/2010 | Park et al. |
| 2012/0103945 | A1 | 5/2012 | Straw et al. |
| 2016/0307993 | A1 | 10/2016 | Kuribayashi et al. |
| 2017/0221671 | A1 | 8/2017 | Asai et al. |
| 2017/0221677 | A1 | 8/2017 | Asai et al. |

FOREIGN PATENT DOCUMENTS

| | | | |
|---|---|---|---|
| JP | 2002-216653 | A | 8/2002 |
| JP | 2004-509436 | A | 3/2004 |
| JP | 2011-527639 | A | 11/2011 |
| JP | 2016-31869 | A | 3/2016 |
| TW | 201112415 | A1 | 4/2011 |
| WO | WO 2016/010097 | A | 1/2016 |
| WO | WO 2016/017661 | A1 | 2/2016 |

OTHER PUBLICATIONS

Japanese-language Written Opinion (PCT/ISA/237) issued in PCT Application No. PCT/JP2019/050527 dated Mar. 3, 2020 (three (3) pages).
Taiwanese-language Office Action issued in Taiwanese Application No. 109145412 dated Sep. 30, 2021 (four (4) pages).
Korean-language Office Action issued in Korean Application No. 10-2022-7019074 dated Jul. 30, 2024 with English Translation (13 pages).

[FIG. 1]
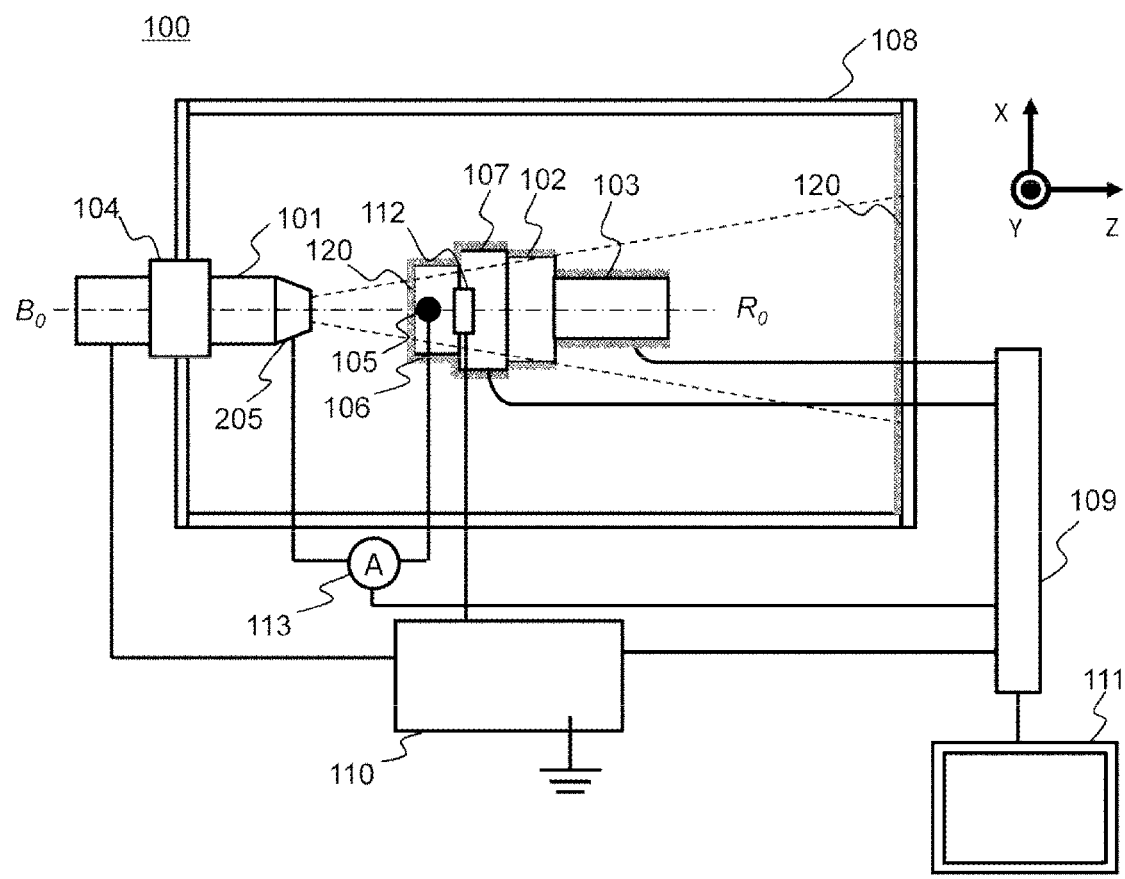

[FIG. 2]
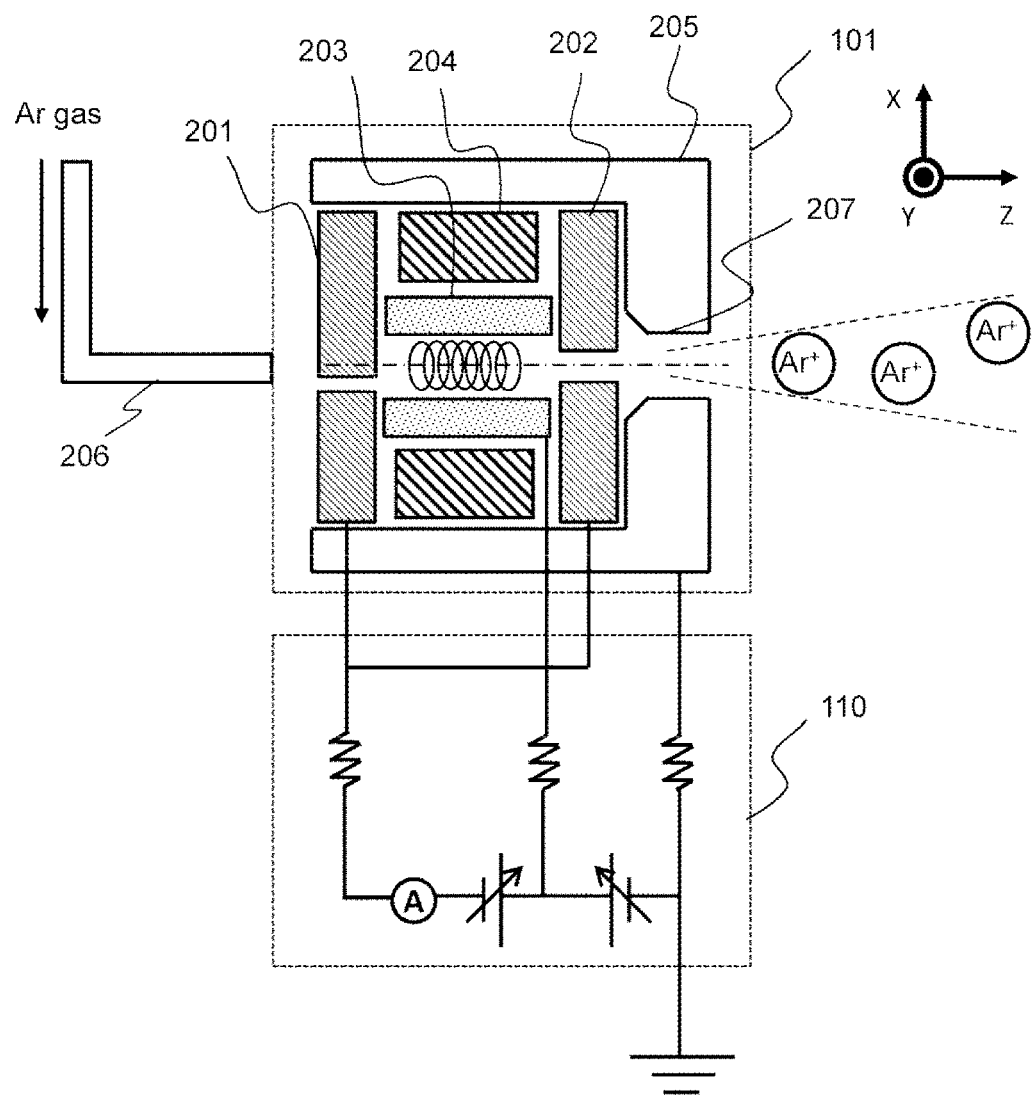

[FIG. 3]
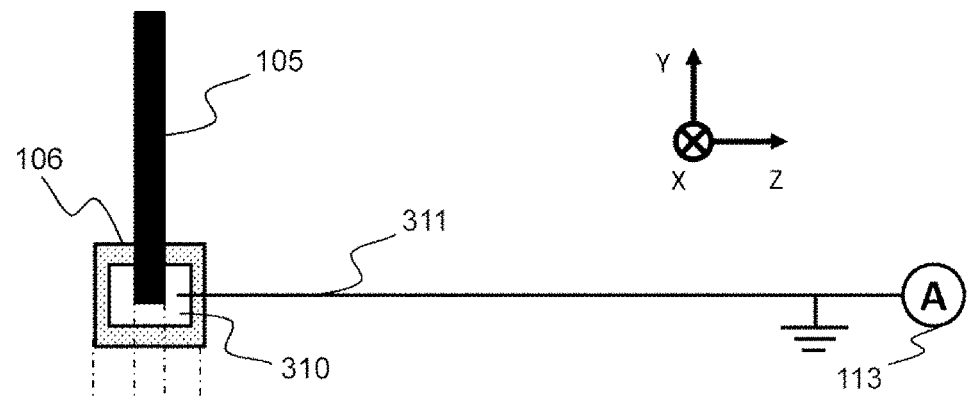
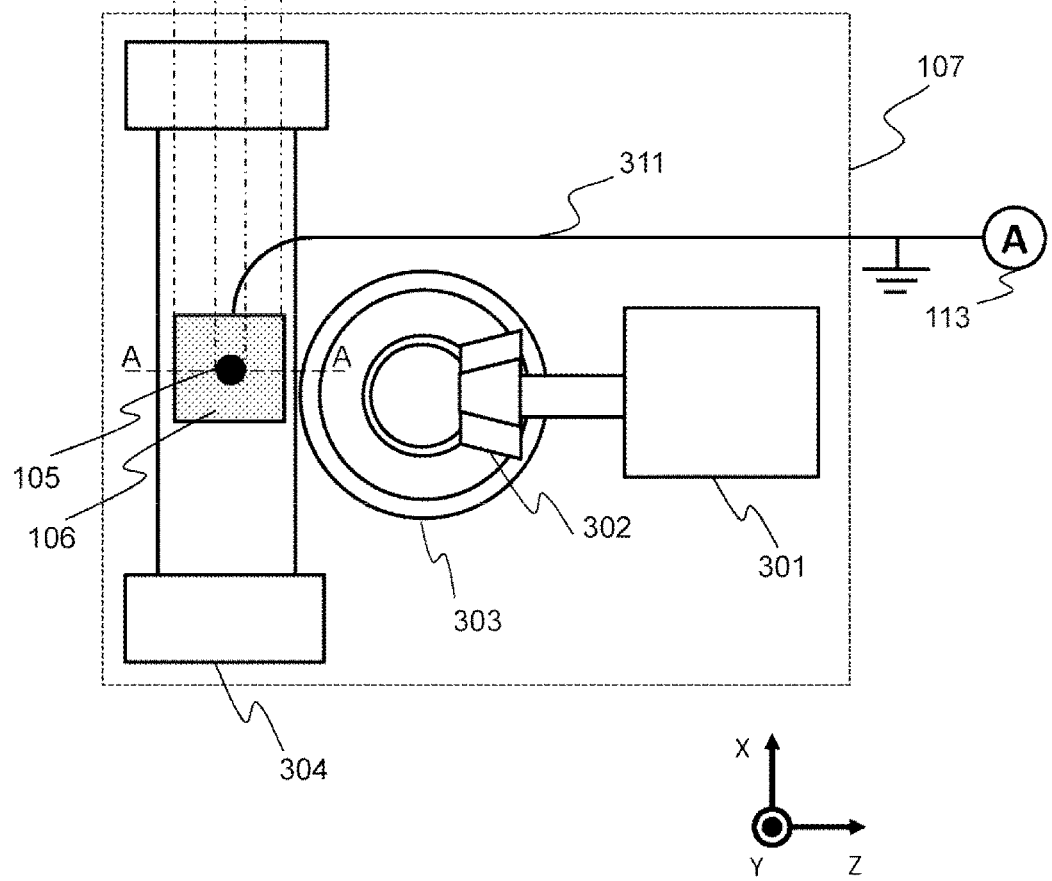

[FIG. 4]
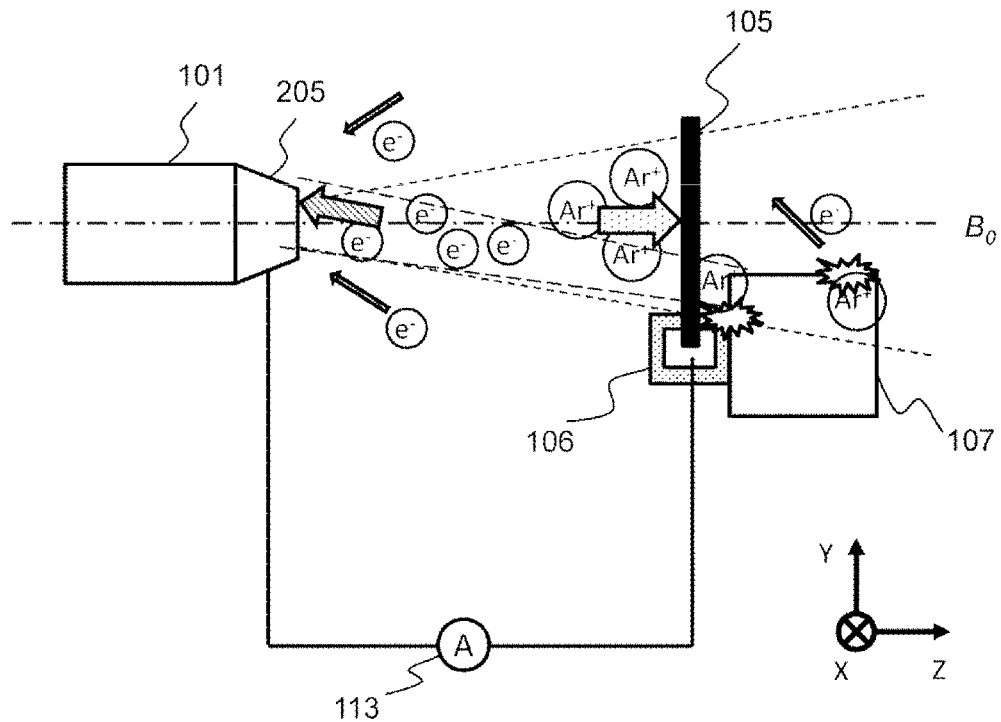
[FIG. 5]
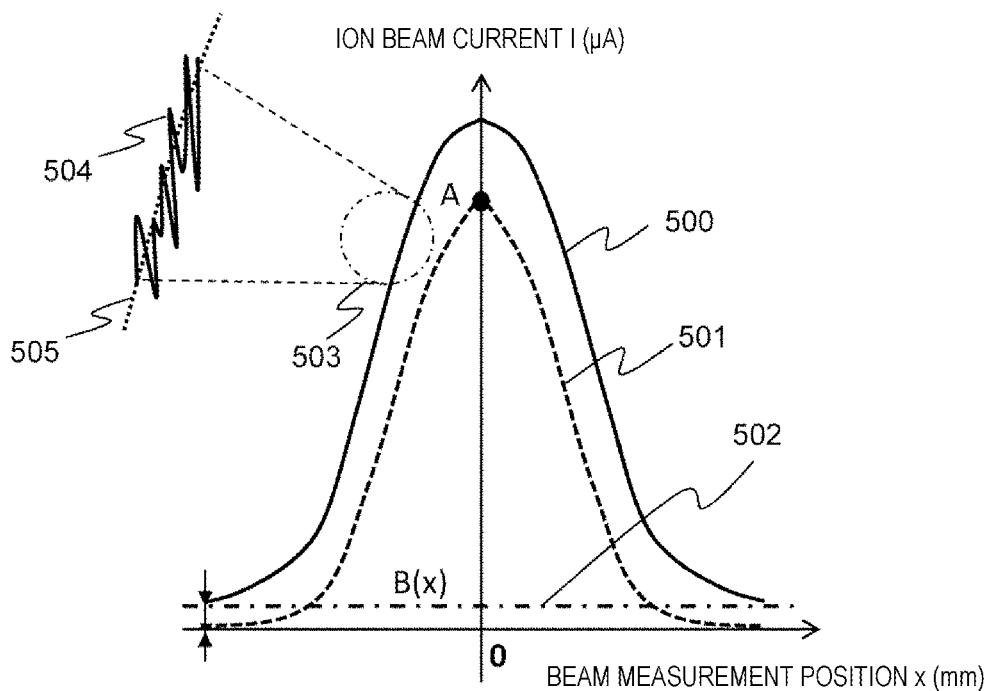

[FIG. 6A]
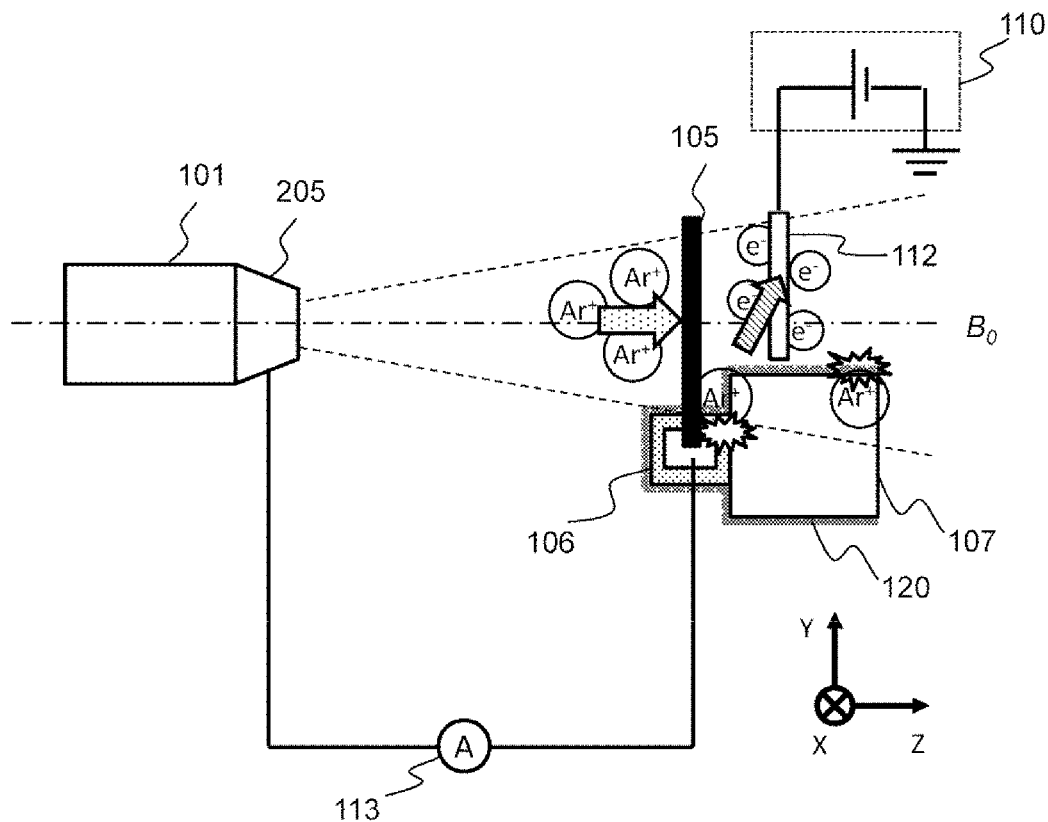
[FIG. 6B]
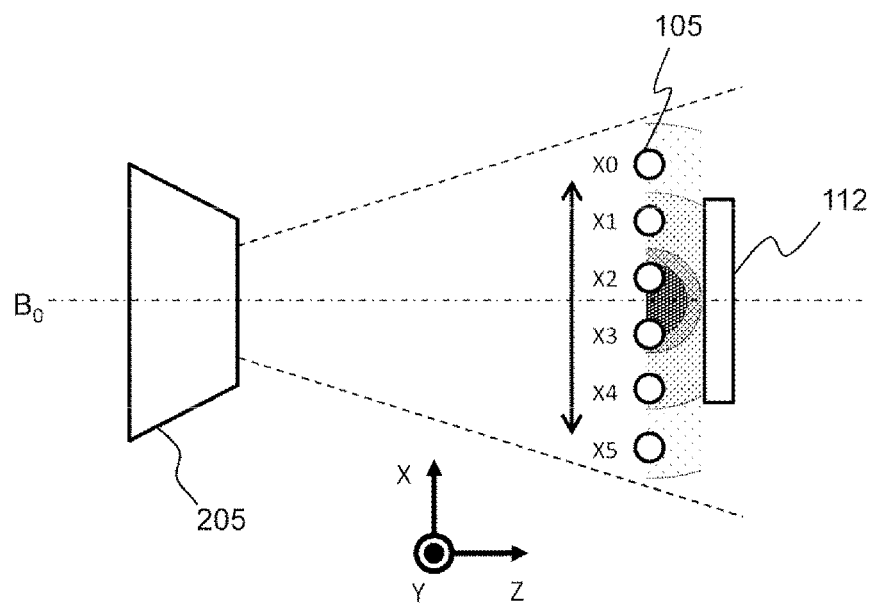

[FIG. 7A]
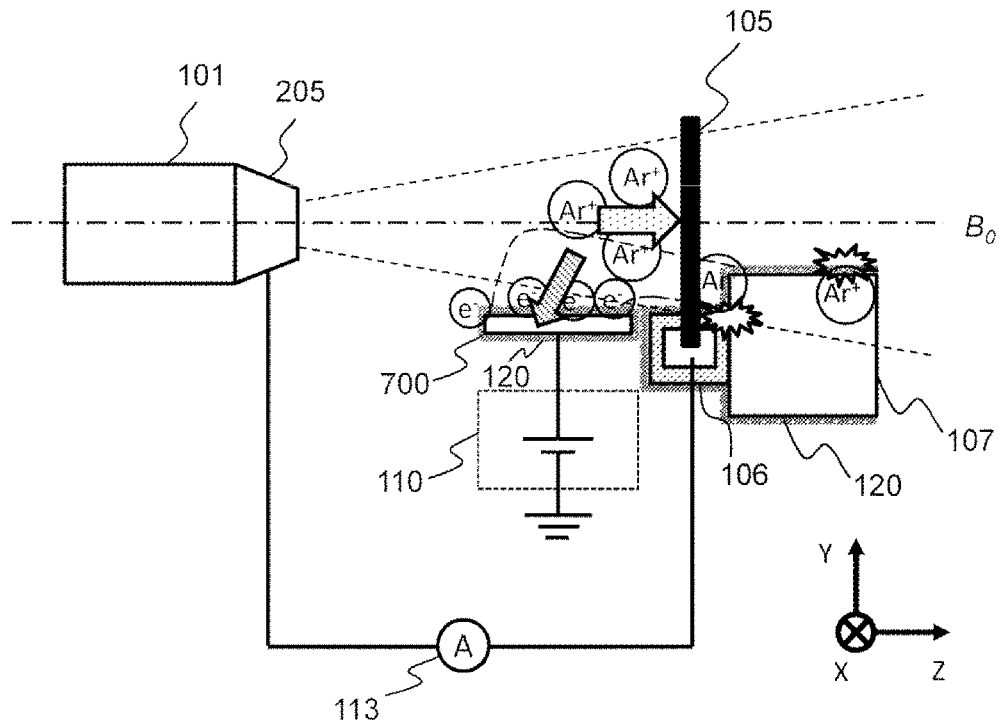
[FIG. 7B]
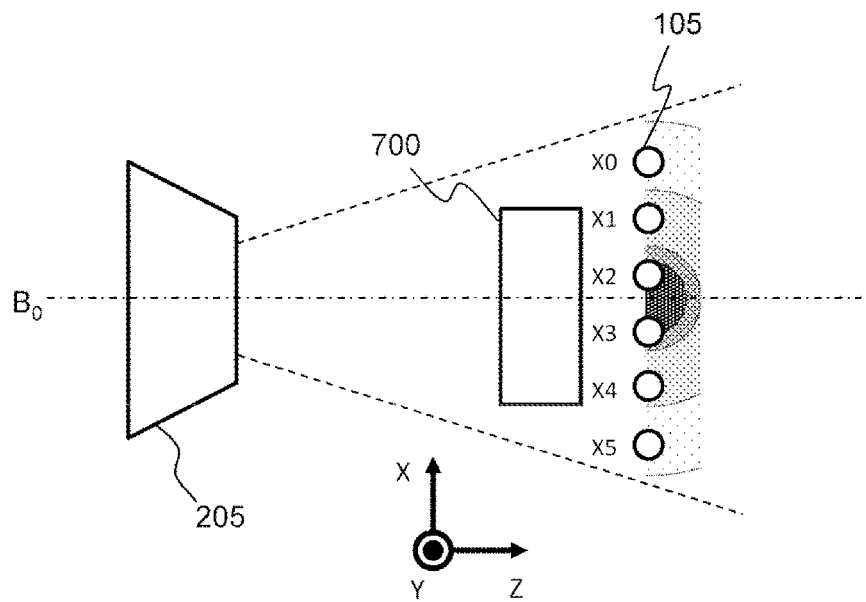

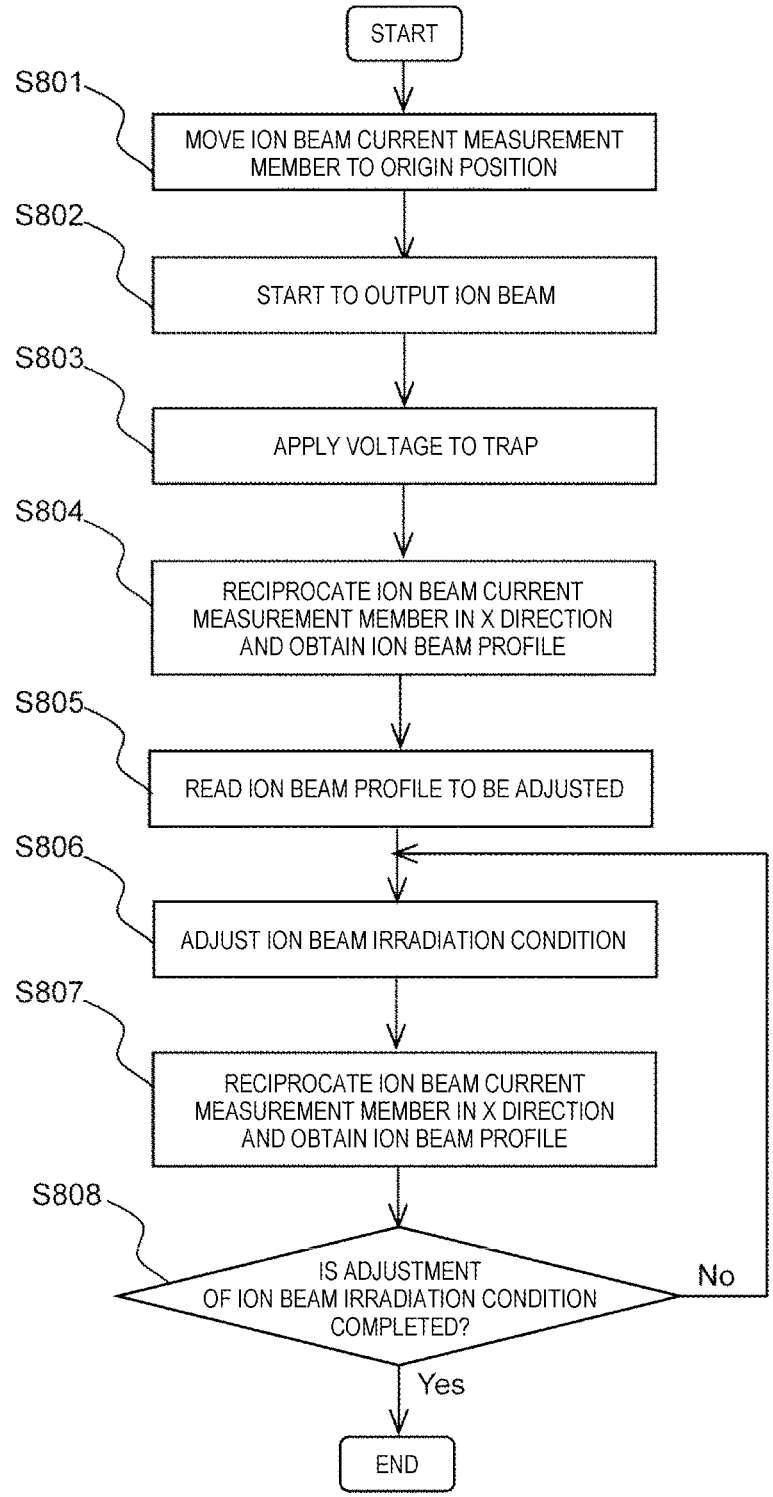
[FIG. 8]

ION MILLING DEVICE

TECHNICAL FIELD

The present invention relates to an ion milling apparatus.

BACKGROUND ART

PTL 1 discloses an ion milling apparatus in which plasma is generated in an ion source to extract ions, and the extracted ions are emitted to perform a processing treatment on a substrate or the like. This ion milling apparatus performs processing on, for example, a 4-inch ($\Phi$100) substrate. In order to obtain a large-diameter ion beam having a uniform or desired distribution, an ion milling apparatus is disclosed in which the distribution of the extracted ion beam is controlled by electrically controlling a plasma distribution in the ion source. As an example of a control method, a control method is disclosed in which a distribution state of the ion beam is measured using a Faraday cup, and a voltage applied to a plasma control electrode is adjusted based on a measurement result.

CITATION LIST

Patent Literature

PTL 1: JP-A-2002-216653

SUMMARY OF INVENTION

Technical Problem

The ion milling apparatus is an apparatus for polishing a surface or a cross section of a sample (for example, metal, semiconductor, glass, ceramic, or the like) by irradiating the sample with an unfocused ion beam and repelling atoms on the surface of the sample with no stress by a sputtering phenomenon. The ion milling apparatus is used as a pretreatment apparatus for observing the surface or the cross section of the sample by a scanning electron microscope (SEM) or a transmission electron microscope (TEM). The ion source for such a pretreatment apparatus often employs a penning system effective for reducing a size of a structure.

Since the sample is irradiated with the ion beam from the penning type ion source without being converged, an ion distribution in the vicinity of an ion beam irradiation point of the sample has a characteristic in which an ion density in a central portion is the highest and the ion density decreases from the center toward the outside. On the other hand, particularly in surface observation with an electron microscope, it is necessary to polish the surface of the sample smoothly in order to accurately observe the structure and composition. Therefore, the ion beam is emitted at a low incident angle while the sample is being rotated. Accordingly, it is possible to obtain a wide and smooth processed surface in a peripheral range including a site to be observed. Since the ion density is directly linked to a processing speed (milling rate) of the sample, the characteristic of the ion distribution greatly affects a processed shape of the processed surface of the sample.

It is known that ions generated and emitted from the ion source adopting the penning method wear internal components due to the structure of the ion source. In addition, as a result of processing the sample, fine particles generated and suspended from the processed surface adhere to the ion source, in particular, an ion beam emission port, which causes contamination. Due to these factors, when the ion milling apparatus is continuously used, the characteristic of the ion beam is changed, and the reproducibility of the processed shape of the processed surface of the sample is reduced. When observation by the electron microscope is performed for a purpose of mass production process management, it is required to perform the same processing on a large number of samples. Therefore, the reduction in the reproducibility of the processed shape of the ion milling apparatus may lead to a reduction in defect detection accuracy.

In view of such a problem, the invention provides an ion milling apparatus capable of adjusting an irradiation condition of an ion beam suitable for the ion milling apparatus that performs pretreatment processing of observing a surface or a cross section of a sample.

Solution to Problem

An ion milling apparatus according to an embodiment of the invention includes: an ion source; a sample stage on which a sample to be processed by being irradiated with an unfocused ion beam from the ion source is placed; a measurement member holding unit that holds a linear ion beam current measurement member extending in a first direction; and a control unit. A covering material is provided so as to cover at least a surface of the measurement member holding unit and the sample stage facing the ion source. A material of the covering material contains, as a main component, an element having an atomic number smaller than that of an element of a material of a structure on which the covering material is provided. The control unit is configured to move the ion beam current measurement member in an irradiation range of the ion beam on a trajectory, which is located between the ion source and the sample stage and extends in a second direction orthogonal to the first direction, in a state where the ion beam is output from the ion source under a first irradiation condition, and measure an ion beam current flowing through the ion beam current measurement member when the ion beam current measurement member is irradiated with the ion beam.

Advantageous Effects of Invention

Reproducibility of an ion distribution of an ion milling apparatus can be enhanced.

Other technical problems and novel features will be apparent from a description of the present specification and the accompanying drawings.

BRIEF DESCRIPTION OF DRAWINGS

FIG. 1 shows a configuration example (schematic diagram) of an ion milling apparatus.

FIG. 2 is a diagram showing a configuration of an ion source and a power supply circuit.

FIG. 3 shows a configuration example of a drive unit.

FIG. 4 is a diagram showing a state of measurement of an ion beam current in a comparative example.

FIG. 5 is a diagram showing an ion beam profile measured in the comparative example.

FIG. 6A is a diagram showing a state of measurement of an ion beam current in an embodiment.

FIG. 6B is a diagram showing a positional relationship between a trajectory of an ion beam current measurement member and an electron trap in the embodiment.

FIG. 7A is a diagram showing a state of measurement of an ion beam current in a modification.

FIG. 7B is a diagram showing a positional relationship between a trajectory of an ion beam current measurement member and an electron trap in the modification.

FIG. 8 is a flowchart of adjustment of an ion beam irradiation condition.

DESCRIPTION OF EMBODIMENTS

Hereinafter, embodiments of the invention will be described with reference to the drawings.

FIG. 1 is a diagram (schematic diagram) showing a main part of an ion milling apparatus 100 according to an embodiment of the invention from above (a vertical direction is referred to as a Y direction). A sample chamber 108 capable of maintaining a vacuum state includes an ion source 101 attached to the sample chamber 108 via an ion source position adjustment mechanism 104, a sample stage 102 where a sample to be processed is placed, and a sample stage rotation drive source 103 for rotating the sample stage 102 about a rotation center $R_0$ as an axis. Since the sample is irradiated with an ion beam from the ion source 101 without being focused, an ion beam distribution in the vicinity of an ion beam irradiation point of the sample has a characteristic in which an ion density in a central portion is the highest and the ion density decreases from a center toward the outside. Since the ion density is directly linked to a processing speed of the sample, the ion beam distribution in the vicinity of the ion beam irradiation point greatly affects a processed shape of the sample. Therefore, in order to measure the ion beam distribution of the unfocused ion beam from the ion source 101, the ion milling apparatus 100 includes an ion beam current measurement member 105 disposed close to a sample placing surface of the sample stage 102, a measurement member holding unit 106 that holds the ion beam current measurement member 105, a drive unit 107 that reciprocally drives the measurement member holding unit 106 in an X direction, and an electron trap 112. Each mechanism constituting the ion milling apparatus 100 is supplied with power from a power supply unit 110 and controlled by a control unit 109. In addition, control parameters, operation states, or the like of the apparatus are displayed on a display unit 111.

Since the ion beam from the ion source 101 is emitted in a state of radially spreading around an ion beam center $B_0$, it is necessary to adjust the rotation center $R_0$ of the sample stage 102 to coincide with the ion beam center $B_0$. In order to facilitate this adjustment, the ion source 101 is attached to the sample chamber 108 via the ion source position adjustment mechanism 104 that adjusts a position of the ion source 101 in the X direction, the Y direction, and a Z direction. Accordingly, a position of the ion beam center $B_0$ of the ion source 101, specifically, a position on an XY plane (plane including the X direction and the Y direction) and a working distance (WD, position in the Z direction) can be adjusted.

Although details will be described later, the ion beam current measurement member 105 is a conductive member. An amount of ions colliding with the ion beam current measurement member 105 from the ion source 101 is measured by an ammeter 113 as an ion beam current between the ion source 101 and the ion beam current measurement member 105. The control unit 109 obtains the ion beam current at each position along the X direction by measuring the ion beam current by the ammeter 113 while moving the ion beam current measurement member 105 in the X direction, and displays the ion beam current on the display unit 111 as an ion beam profile. In addition, during the measurement of the ion beam profile, the electron trap 112 is disposed closer to the side of the sample stage 102 than the ion beam current measurement member 105 and at a position where the ion beam current measurement member 105 and the electron trap 112 overlap each other as viewed from the ion source 101 when the ion beam center $B_0$ and the ion beam current measurement member 105 intersect each other. A predetermined positive potential is applied to the electron trap 112 from the power supply unit 110.

Further, a covering material 120 is provided on structures disposed in the sample chamber 108, specifically, on the measurement member holding unit 106, the drive unit 107, the sample stage 102, the sample stage rotation drive source 103, and an inner wall of the sample chamber 108. As an example of the covering material 120, a light element such as carbon can be used. A carbon paste may be applied to an irradiation region of the ion beam, or a carbon plate material may be attached to the irradiation region. In addition, a resin having high heat resistance may be applied. This is because an organic substance contains carbon (C). Since the covering material 120 is heated by being irradiated with the ion beam, the covering material is required to have heat resistance. For example, polytetrafluoroethylene (PTFE), aromatic polyether ketone (for example, PEEK: polyether ether ketone, PEK: polyether ether ketone), or the like can be applied. Further, carbon particles may be mixed with a resin and applied. A function of the covering material will be described later.

FIG. 2 is a schematic diagram showing an internal structure of the ion source 101 and a power supply circuit of the power supply unit 110 that applies a voltage of the ion source 101. The power supply circuit only shows a circuit related to the ion source 101. FIG. 2 shows an ion source (a penning type ion source) employing a penning method as the ion source 101. In the penning type ion source, an anode 203 to which a discharge voltage is applied from the power supply unit 110 is disposed between a first cathode 201 and a second cathode 202 which are set to the same potential, and electrons are generated by a potential difference between the anode and the cathode. The generated electrons are retained inside the ion source by a permanent magnet 204. On the other hand, argon gas is introduced into the ion source from the outside through a pipe 206, and the electrons and the argon gas collide with each other to generate argon ions. The argon ions are attracted to an acceleration electrode 205 to which an acceleration voltage is applied, and are emitted as an ion beam through an ion beam irradiation port 207.

In the ion source 101, while the irradiation of the beam is repeated, internal components of the ion source 101 are worn, or fine particles generated from a workpiece to be irradiated are scattered and adhere to the ion beam irradiation port 207, resulting in a change of the ion beam distribution emitted by the ion source 101. By performing maintenance such as replacement and cleaning of the internal components of the ion source 101, the wear of the internal components and the adhesion of fine particles to the ion beam irradiation port 207 are eliminated, but it is not guaranteed that the ion beam distribution is returned to the ion beam distribution before the change. Therefore, for example, the ion beam distribution is confirmed after the maintenance is performed, and the working distance, the discharge voltage, and a gas flow rate of the ion source 101 are adjusted such that a desired ion beam distribution is obtained. Accordingly, reproducibility of the processing by the ion milling apparatus can be enhanced.

FIG. 3 shows a configuration example of the drive unit 107 for driving the ion beam current measurement member 105. In the drawing, a top view of the drive unit 107 and a cross-sectional view of the ion beam current measurement member 105 and the measurement member holding unit 106 taken along a line A-A of the top view are shown. The illustration of the covering material is omitted.

The measurement member holding unit 106 is made of an insulating material, and an ion beam current extraction unit 310 having conductivity is provided inside the measurement member holding unit 106. The ion beam current measurement member 105 is attached to the ion beam current extraction unit 310, and is connected to an ion beam current extraction wiring 311 via the ion beam current extraction unit 310. The ion beam current extraction wiring 311 is connected to the ammeter 113.

The drive unit 107 includes a motor 301, a bevel gear 302, a gear 303, and a rail member 304. The bevel gear 302 and the gear 303 provided on a drive shaft of the motor 301 rotate to transmit the drive to the rail member 304, thereby reciprocating the measurement member holding unit 106 in the X direction. A trajectory on which the measurement member holding unit 106 reciprocates is located between the ion source 101 and the sample stage 102. It is desirable to be located as close as possible to the sample stage 102. The motor 301 does not need to be provided exclusively for the drive unit 107, and can also be used as the sample stage rotation drive source 103 that rotates the sample stage 102.

During the measurement of the ion beam current, the ion beam current measurement member 105 is irradiated with the ion beam from the ion source 101, such that the ion beam current measurement member 105 is in a processed state. Accordingly, since the ion beam current measurement member 105 is a member that is consumed for each measurement, a member having a low sputtering yield, which is difficult to be processed by ions, is suitable. In addition, a linear material is used as the ion beam current measurement member 105, and the ion beam profile is measured by moving the ion beam current measurement member 105 in an unfocused ion beam irradiation range. This means that a diameter of the ion beam current measurement member 105 determines a spatial resolution of the ion distribution that can be measured. Therefore, it is desirable that the diameter of the ion beam current measurement member 105 is set to be smaller than a half width of the ion beam during processing. For example, a linear material of graphite carbon having a diameter of 0.2 mm or more and 0.5 mm or less can be used. In addition, in order to prevent irregular behavior of ions due to collision of ions with the ion beam current measurement member 105, it is desirable that a cross-sectional shape of the ion beam current measurement member 105 is circular. In addition to the linear material of graphite carbon, a linear material of tungsten or the like can also be used. The ion beam current measurement member 105 is detachable from the measurement member holding unit 106. When the ion beam current measurement member 105 is consumed by the ion beam, the ion beam current measurement member 105 is replaced with a new ion beam current measurement member.

FIG. 4 is a schematic diagram showing a state in which an ion beam current is measured without providing the electron trap 112 and the covering material 120 as a comparative example. In the present measurement method, the ammeter 113 measures a current flowing when argon ions having positive charges emitted from the ion source 101 collide with the ion beam current measurement member 105. However, in the configuration of the comparative example, it is confirmed that a current value is measured from the ammeter 113 although the ion beam current measurement member 105 is moved to a position where the ion beam is not emitted (first problem). This is because the argon ions collide with a structure in the vicinity of the ion beam current measurement member 105, specifically, the measurement member holding unit 106 or the like to generate secondary electrons or backscattered electrons, and the generated secondary electrons or backscattered electrons collide with the acceleration electrode 205 of the ion source 101 to increase the current value measured by the ammeter 113.

FIG. 5 shows an ion beam profile measured by the comparative example of FIG. 4. A horizontal axis represents a beam measurement position, and a vertical axis represents an ion beam current I measured by the ammeter 113. The beam measurement position is represented with an intersection point between the trajectory of the ion beam current measurement member 105 and the ion beam center $B_0$ on the XZ plane as an origin. As described above, a measured ion beam profile 500 is a sum of a true ion beam profile 501 flowing due to collision of argon ions with the ion beam current measurement member 105 and a background noise profile 502 due to electrons generated by irradiation of the ion beam. In FIG. 5, the background noise profile 502 is represented as a constant value in a simplified manner, but in practice, the background noise profile 502 has a value that changes depending on a measurement position due to variation in generation of secondary electrons and backscattered electrons and a difference in the amount of collision of electrons with the ion beam current measurement member 105 depending on the beam measurement position.

It is considered that the true ion beam profile 501 follows the Gaussian distribution. Therefore, a measured ion beam current I(x) can be represented by (Equation 1).

$$I(x) = \frac{A}{\sigma} e(-x^2 /_{2\sigma^2}) t5 + B(x) \qquad \text{[Equation 1]}$$

Here, A is a maximum value of the true ion beam profile, and σ is a dispersion of the true ion beam profile. That is, in order to obtain information of the true ion beam profile 501, it is necessary to remove an influence of the background noise profile 502 from the measured ion beam profile 500.

In addition, FIG. 5 shows a waveform 504 obtained by enlarging a part 503 of the measured ion beam profile 500. The actually measured ion beam profile 500 includes a high-frequency noise waveform. By averaging data of the measured ion beam current value, a smooth profile waveform (waveform 505) can be obtained. When a noise component is large, the amount of data necessary for smoothing the ion beam profile increases. Therefore, a moving speed of the ion beam current measurement member 105 cannot be increased, and a measurement time of the ion beam profile 500 cannot be shortened (second problem). This is because the ion beam from the ion source 101 is emitted in an unfocused manner, such that argon ions are scattered in a wide region of the sample chamber 108. Although an ion beam intensity is low, the argon ions collide with the inner wall of the sample chamber 108 and the structure in the sample chamber 108 in a wide range, and secondary electrons and backscattered electrons are generated and collide with the acceleration electrode 205 of the ion source 101 (see FIG. 4). The secondary electrons and the backscattered electrons are measured as noise of an ion beam profile waveform.

FIG. 6A shows a state in which the ion beam current is measured when the plate-shaped electron trap 112 and the covering material 120 are provided. FIG. 6B shows a positional relationship between the trajectory of the ion beam current measurement member 105 (coordinates X0 to X5 indicate positions on the trajectory) and the electron trap 112. In addition, the ion beam intensity in the vicinity of the trajectory of the ion beam current measurement member 105 is schematically shown by shading. The ion beam intensity decreases according to the Gaussian distribution toward a periphery of the ion beam center $B_0$, which has a maximum intensity. A region having a high ion beam intensity is displayed as a region having a high concentration, and a region having a low beam intensity is displayed as a region having a low concentration.

Since secondary electrons and backscattered electrons generated by collision of argon ions have negative charges, the electron trap 112 to which a positive voltage is applied is provided in the vicinity of the trajectory of the ion beam current measurement member 105, and the generated secondary electrons and backscattered electrons are captured. The voltage applied to the electron trap 112 is supplied from the power supply unit 110, and a voltage value is set by the control unit 109 (not shown). The positive voltage applied to the electron trap 112 is set as a positive voltage that does not affect the measurement of the ion beam profile.

The electron trap 112 is disposed closer to the side of the sample stage 102 than the trajectory of the ion beam current measurement member 105 and the ion beam current measurement member 105 and the electron trap 112 overlap each other as viewed from the ion source 101 when the ion beam center $B_0$ and the ion beam current measurement member 105 intersect each other. As shown in FIG. 6B, the ion beam intensity of the ion source 101 is the highest in the vicinity of the ion beam center $B_0$, and a generation amount of secondary electrons and backscattered electrons and energy are large. Therefore, the electron trap 112 is disposed in the vicinity of the ion beam center $B_0$, so that the generated secondary electrons and the backscattered electrons can be efficiently captured.

However, when the electron trap 112 is disposed as shown in FIG. 6A, the electron trap 112 itself may become a source of generating secondary electrons and backscattered electrons due to collision with argon ions. In particular, since the backscattered electrons have high energy and high straightness, the amount of electrons reaching the acceleration electrode 205 is also large. Here, since it is known that the generation amount of the backscattered electrons increases as an atomic number of a constituent element to be irradiated increases, it is desirable to use a material having a light element and a low sputtering yield for the electron trap 112. Specifically, graphite carbon is preferably used.

Accordingly, by removing the influence of the secondary electrons and the backscattered electrons, which are generated from the structure such as the measurement member holding unit 106, by the electron trap 112, it is possible to obtain the information of the true ion beam profile 501 as shown by a broken line in FIG. 5. The electron trap 112 needs to have a certain area in order to efficiently capture the secondary electrons and the backscattered electrons, but a size of the electron trap 112 is not limited. For example, the electron trap 112 may be a plate electrode having a circular shape with the ion beam center $B_0$ as a center and the half width of the ion beam as a diameter or having a rectangular shape with one circular side. In addition, as long as electrons can be trapped, the electrode is not limited to the plate electrode, and a mesh electrode and other electrodes are allowed.

In addition, the covering material 120 is irradiated with the ion beam having a relatively weak intensity, so that the amount of generated electrons is reduced, and the noise of the ion beam profile waveform can be reduced. The reason is as shown below. As described above, the generation amount of the backscattered electrons increases as the atomic number of the constituent element to be irradiated increases. By using, as the material of the covering material 120, a material containing, as a main component, an element having an atomic number smaller than that of an element of a material of a structure to be covered or the inner wall, it is possible to effectively prevent generation of backscattered electrons.

The covering material 120 may not necessarily cover the entire surface of the structure or the entire wall surface of the sample chamber 108, but it is desirable to cover at least a surface facing the ion source 101. This is because the ion beam has strong straightness, and the amounts of secondary electrons and backscattered electrons generated per unit area from the surface facing the ion source 101 are larger than those of the other surfaces.

FIGS. 7A and 7B show a modification of the electron trap. In FIG. 6A, the electron trap is disposed behind the ion beam current measurement member 105 when viewed from the ion source 101, whereas in FIG. 7A, the electron trap is disposed closer to the side of the ion source 101 than the ion beam current measurement member 105. FIG. 7A is a side view, and FIG. 7B is a top view. A voltage applied to an electron trap 700 is also supplied from the power supply unit 110, and a voltage value is set by the control unit 109 (not shown). The electron trap 700 is disposed in a region not irradiated with the ion beam from the ion source 101, and captures the generated secondary electrons and backscattered electrons before the secondary electrons and the backscattered electrons reach the acceleration electrode 205. Unlike the electron trap 112 shown in FIGS. 6A and 6B, the electron trap 700 is not irradiated with the ion beam, and thus a material having high conductivity such as copper or phosphor bronze can be used as the electron trap 700. In this example, the covering material 120 is also provided on a surface of the electron trap 700 (the covering material 120 is omitted in FIG. 7B). Both the electron trap 112 and the electron trap 700 may be provided.

A method for obtaining an ion beam profile and adjusting an ion beam irradiation condition executed by the control unit 109 in the ion milling apparatus shown in FIG. 1 will be described with reference to a flowchart of FIG. 8.

In S801, the control unit 109 controls the drive unit 107 to move the ion beam current measurement member 105 to an origin position. Here, the origin position is set to be a center of the ion beam irradiation range, but the setting of the origin position is not limited thereto.

In S802, the control unit 109 controls the power supply unit 110 to output the ion beam from the ion source 101 according to the ion beam irradiation condition stored as a current setting. The current setting refers to an ion beam irradiation condition determined as a processing condition of the sample. In general, an acceleration voltage, a discharge voltage, and a gas flow rate of the ion source 101 during processing of the sample are determined.

In S803, the control unit 109 controls the power supply unit 110 to apply a predetermined voltage to the electron trap 112 (and/or the electron trap 700). The positive voltage applied to the electron trap is determined to a voltage within a range that does not adversely affect the measurement of the ion beam profile.

In S804, after the output of the ion beam is started, the control unit 109 controls the drive unit 107 to measure the ion beam current by the ammeter 113 while reciprocating the ion beam current measurement member 105 in the X direction. The control unit 109 obtains the ion beam profile by associating the position of the ion beam current measurement member 105 in the X direction with the current value at the position. The obtained ion beam profile is displayed on the display unit 111.

In S805, the ion beam profile to be adjusted is read and displayed on the display unit 111. This step may be performed before obtaining of the ion beam profile (S804).

In S806, the ion beam irradiation condition is adjusted such that the ion beam profile obtained in S804 approximates the target ion beam profile read in S805. Specifically, one or more parameters of the working distance, the discharge voltage, and the gas flow rate of the ion source 101 are adjusted.

At this time, the acceleration voltage is not to be adjusted. This is because, when the acceleration voltage is changed, the processing speed (milling rate) of the sample is greatly changed even with the same ion beam current.

In S807, the ion beam profile is obtained again under the adjusted ion beam irradiation condition. The processing in S807 is the same as the processing in S804.

In S808, the ion beam profile obtained in S807 is compared with the target ion beam profile read in S805, if a desired ion beam profile is obtained, the processing ends, if the desired ion beam profile is not obtained, the steps from the adjustment of the ion beam irradiation condition (S806) are repeated.

Although the invention made by the present inventors has been specifically described based on the embodiments, the invention is not limited to the described embodiments, and various modifications can be made without departing from the gist of the invention. For example, a structure that is located in the vicinity of the ion beam current measurement member 105 and does not operate during the measurement of the ion beam profile, for example, a sample stage functions as an electron trap by making it possible to apply a positive potential to the sample stage. In addition, as long as the ion milling apparatus includes a sample stage position adjustment mechanism capable of moving the sample stage in the Z direction, the working distance may be adjusted by the sample stage position adjustment mechanism. In addition, a material or a covering method of the covering material may be changed depending on an object to be covered. The range covered with the covering material is not limited to the range described in the embodiment. For example, the measurement member holding unit or the sample stage irradiated with the ion beam may be covered without covering all of the structures of the sample chamber 108, and the covering material may not be provided for the structures, which are disposed such that the ion beam is difficult to be emitted to these structures. In addition, although an example in which the covering material is provided on the entire inner wall of the sample chamber 108 facing the ion source 101 is shown, the covering material may be provided only in a region in which the ion beam intensity is relatively strong around an intersection point of the ion beam center $B_0$ and the inner wall.

In addition, in the adjustment of the ion beam irradiation condition, the ion beam irradiation condition of the ion beam profile may be adjusted as a reference, or features of the ion beam profile, for example, a peak value and a half width of the ion beam profile may be calculated, and the ion beam irradiation condition may be adjusted such that the features coincide with each other. At this time, the display unit 111 may display the features as the adjusted reference instead of displaying the ion beam irradiation condition of the ion beam profile.

REFERENCE SIGNS LIST

100: ion milling apparatus
101: ion source
102: sample stage
103: sample stage rotation drive source
104: ion source position adjustment mechanism
105: ion beam current measurement member
106: measurement member holding unit
107: drive unit
108: sample chamber
109: control unit
110: power supply unit
111: display unit
112: electron trap
113: ammeter
120: covering material
201: first cathode
202: second cathode
203: anode
204: permanent magnet
205: acceleration electrode
206: pipe
207: ion beam irradiation port
301: motor
302: bevel gear
303: gear
304: rail member
310: ion beam current extraction unit
311: ion beam current extraction wiring
700: electron trap

The invention claimed is:

1. An ion milling apparatus comprising:
an ion source;
a sample stage on which a sample to be processed by being irradiated with an unfocused ion beam from the ion source is placed;
a measurement member holding unit that holds a linear ion beam current measurement member extending in a first direction; and
a control unit, wherein
a covering material is provided so as to cover at least a surface of the measurement member holding unit and the sample stage facing the ion source,
a material of the covering material contains, as a main component, an element having an atomic number smaller than that of an element of a material of a structure on which the covering material is provided, and
the control unit is configured to move the ion beam current measurement member in an irradiation range of the ion beam on a trajectory, which is located between the ion source and the sample stage and extends in a second direction orthogonal to the first direction, in a state where the ion beam is output from the ion source under a first irradiation condition, and measure an ion beam current flowing through the ion beam current measurement member when the ion beam current measurement member is irradiated with the ion beam.

2. The ion milling apparatus according to claim 1, further comprising:
a sample chamber, wherein
the covering material is provided on an inner wall of the sample chamber facing the ion source.

3. The ion milling apparatus according to claim 1, wherein the covering material contains carbon as a main component.

4. The ion milling apparatus according to claim 1, further comprising:
an electrode disposed in a vicinity of the trajectory, wherein
the control unit is configured to measure the ion beam current in a state where a predetermined positive voltage is applied to the electrode.

5. The ion milling apparatus according to claim 4, wherein the control unit is configured to measure an ion beam profile indicating a relationship between the ion beam current and a position of the ion beam current measurement member when the ion beam current is measured.

6. The ion milling apparatus according to claim 5, wherein the control unit is configured to calculate a peak value and a half width of the ion beam profile.

7. The ion milling apparatus according to claim 5, further comprising:
a sample chamber; and
an ion source position adjustment mechanism disposed in the sample chamber, wherein
the ion source is attached to the sample chamber via the ion source position adjustment mechanism,
the ion source is a penning type ion source, and
one or more of a discharge voltage of the ion source, and a gas flow rate or a working distance of the ion source are adjustable based on the ion beam profile.

8. The ion milling apparatus according to claim 4, wherein the electrode is disposed closer to the side of the sample stage than the trajectory and at a position where the ion beam current measurement member and the electrode overlap each other as viewed from the ion source when an ion beam center of the ion beam from the ion source and the ion beam current measurement member intersect each other.

9. The ion milling apparatus according to claim 4, wherein the electrode is graphite carbon.

10. The ion milling apparatus according to claim 4, wherein
the electrode is disposed at a position closer to the side of ion source than the trajectory and not irradiated with the ion beam from the ion source.

11. The ion milling apparatus according to claim 10, wherein
the electrode is copper or phosphor bronze, and
the covering material is provided on the electrode.

12. The ion milling apparatus according to claim 4, wherein
the sample stage is used as the electrode.

13. The ion milling apparatus according to claim 1, wherein
the ion beam current measurement member is a linear material of graphite carbon whose cross section has a cylindrical shape and whose diameter is equal to or less than a half width of the ion beam.

* * * * *